United States Patent
Kuboki et al.

(10) Patent No.: US 12,160,024 B2
(45) Date of Patent: Dec. 3, 2024

(54) WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideyuki Kuboki, Mie (JP); Hiroomi Hiramitsu, Mie (JP); Xueqing Dong, Mie (JP); Masato Tsutsuki, Mie (JP); Yuto Sato, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 456 days.

(21) Appl. No.: 17/621,446

(22) PCT Filed: Jun. 18, 2020

(86) PCT No.: PCT/JP2020/024022
§ 371 (c)(1),
(2) Date: Dec. 21, 2021

(87) PCT Pub. No.: WO2021/005999
PCT Pub. Date: Jan. 14, 2021

(65) Prior Publication Data
US 2022/0344790 A1    Oct. 27, 2022

(30) Foreign Application Priority Data
Jul. 5, 2019    (JP) .................... 2019-125848

(51) Int. Cl.
*H01M 50/50* (2021.01)
*G01K 7/22* (2006.01)
(Continued)

(52) U.S. Cl.
CPC ............ *H01M 50/569* (2021.01); *G01K 7/22* (2013.01); *H01M 10/482* (2013.01);
(Continued)

(58) Field of Classification Search
CPC ............. H01M 50/569; H01M 50/572; H01M 50/578; H01M 50/583; H01M 50/519;
(Continued)

(56) References Cited

U.S. PATENT DOCUMENTS

2010/0255359 A1* 10/2010 Hirakawa ............. H01M 50/30
                                                                429/120
2013/0252049 A1   9/2013 Ein et al.
(Continued)

FOREIGN PATENT DOCUMENTS

CN    205621791    10/2016
JP    2014-503943   2/2014
(Continued)

OTHER PUBLICATIONS

International Search Report issued in International Bureau of WIPO Patent Application No. PCT/JP2020/024022, dated Sep. 8, 2020, along with an English translation thereof.

*Primary Examiner* — Raymond Alejandro
(74) *Attorney, Agent, or Firm* — Greenblum & Bernstein, P.L.C.

(57) ABSTRACT

A wiring module to be attached to a plurality of power storage elements each having an electrode terminal, the wiring module including: a bus bar to be connected to the electrode terminals; and a flexible substrate that is flexible, wherein the bus bar has an extension portion that extends
(Continued)

toward the flexible substrate, the extension portion has a through hole, the flexible substrate side of the through hole is closed off by the flexible substrate, the flexible substrate has a first conductive path for detecting the temperature of an object, and the first conductive path is connected to a thermistor, and the thermistor is disposed in the through hole, the through hole is filled with a resin, and the thermistor is covered with the resin.

6 Claims, 8 Drawing Sheets

(51) Int. Cl.
*H01M 10/48* (2006.01)
*H01M 50/505* (2021.01)
*H01M 50/519* (2021.01)
*H01M 50/569* (2021.01)
*H10K 77/10* (2023.01)

(52) U.S. Cl.
CPC ....... *H01M 10/486* (2013.01); *H01M 50/505* (2021.01); *H01M 50/519* (2021.01); *H10K 77/111* (2023.02)

(58) Field of Classification Search
CPC ............. H01M 50/505; H01M 10/482; H01M 10/486; G01K 7/22; H10K 77/111
See application file for complete search history.

(56) References Cited

U.S. PATENT DOCUMENTS

| | | | |
|---|---|---|---|
| 2015/0194709 A1* | 7/2015 | Ju | H01M 10/486 429/93 |
| 2017/0324225 A1* | 11/2017 | Nakayama | H02B 1/20 |
| 2017/0328783 A1 | 11/2017 | Okamoto et al. | |
| 2018/0034115 A1 | 2/2018 | Li et al. | |
| 2018/0219204 A1 | 8/2018 | Takase et al. | |

FOREIGN PATENT DOCUMENTS

| | | |
|---|---|---|
| JP | 2016-122577 | 7/2016 |
| JP | 2017-027831 | 2/2017 |
| JP | 2018-059902 | 4/2018 |

\* cited by examiner

WIRING MODULE

TECHNICAL FIELD

The present disclosure relates to a wiring module.

BACKGROUND ART

Conventionally, a battery wiring module disclosed in Patent Document 1 is known as a battery wiring module attached to a cell group in which cells each having positive and negative electrode terminals are lined up side by side. This battery wiring module includes connection members that connect the positive and negative electrode terminals of adjacent cells of the plurality of cells, and a flexible printed circuit that has a plurality of voltage detection wires that detect the voltages of the cells via the connection members. At an intermediate position of each voltage detection wire, a thermistor that detects a temperature increase in the voltage detection wire when an overcurrent flows through the voltage detection wire, and limits the current flowing through the voltage detection wire is provided, and each thermistor is overcoated with an insulating resin.

CITATION LIST

Patent Documents

Patent Document 1: 2017-27831A

SUMMARY OF INVENTION

Technical Problem

In a conventional technology, an opening portion from which a coverlay layer is removed is formed around each thermistor. However, the coverlay layer is comparatively thin, and thus there is a concern that, as a result of the insulating resin spilling out from the opening portion when the thermistor is covered with the insulating resin, the amount of insulating resin covering the thermistor will vary. In this case, the overall thermal capacity including the thermistors and the insulating resin will vary for each thermistor, and thus there is a concern that the temperature measurement accuracy of the thermistors will decrease.

The present disclosure aims to provide a wiring module with improved temperature measurement accuracy of a thermistor.

Solution to Problem

The present disclosure is a wiring module to be attached to a plurality of power storage elements each having an electrode terminal, the wiring module including: a bus bar to be connected to the electrode terminals; and a flexible substrate that is flexible, wherein the bus bar has an extension portion that extends toward the flexible substrate, the extension portion has a through hole, the flexible substrate side of the through hole is closed off by the flexible substrate, the flexible substrate has a first conductive path for detecting the temperature of an object, and the first conductive path is connected to a thermistor, and the thermistor is disposed in the through hole, the through hole is filled with a resin, and the thermistor is covered with the resin.

Advantageous Effects of Invention

With the present disclosure, the temperature measurement accuracy of a thermistor can be improved.

DESCRIPTION OF EMBODIMENTS

Figure 1:
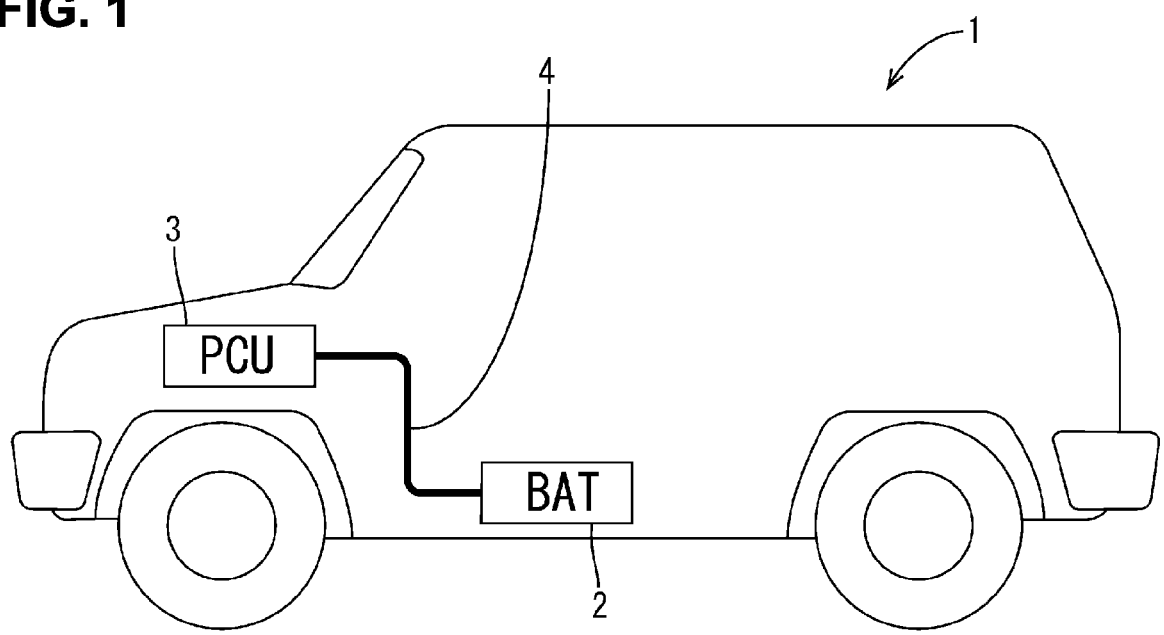
FIG. 1 is a schematic diagram showing a vehicle installed with a power storage module according to Embodiment 1.

Description of Embodiments of the Present Disclosure

First, embodiments of the present disclosure will be listed and described.

(1) The present disclosure is a wiring module to be attached to a plurality of power storage elements each having an electrode terminal, the wiring module including: a bus bar to be connected to the electrode terminals; and a flexible substrate that is flexible, wherein the bus bar has an extension portion that extends toward the flexible substrate, the extension portion has a through hole, the flexible substrate side of the through hole is closed off by the flexible substrate, the flexible substrate has a first conductive path for detecting the temperature of an object, and the first conductive path is connected to a thermistor, and the thermistor is disposed in the through hole, the through hole is filled with a resin, and the thermistor is covered with the resin.

The inner region of the through hole closed off by the flexible substrate can be filled with a predetermined volume of the resin. Thus, the amount of resin filling the through hole can be kept from varying. As a result, the thermal capacity of the thermistor and the resin covering the thermistor can be kept from varying, and thus the temperature measurement accuracy of the thermistor can be improved.

(2) It is preferable that the space between the extension portion and the flexible substrate is liquid-tight As a result of the space between the extension portion and the flexible substrate being liquid-tight, the resin filled into the through-hole closed off by the flexible substrate can be kept from leaking outside from a gap formed between the extension portion and the flexible substrate. Accordingly, the amount of the resin filled into the through hole can be further kept from varying, and thus the temperature measurement accuracy of the thermistor can be further improved.

(3) It is preferable that the present disclosure further includes a linking portion extending from the bus bar to the flexible substrate, wherein the linking portion is connected to a connection land provided on the flexible substrate.

The bus bar and the flexible substrate are connected to each other by the linking portion, and thus the mechanical strength of the portion where the bus bar and the flexible substrate are connected can be improved.

(4) It is preferable that, in the present disclosure, the flexible substrate has a second conductive path configured to detect the voltages of the power storage elements, and the connection land is connected to the second conductive path.

The voltage of the power storage element can be detected via the linking portion, and thus the number of parts can be reduced compared to a case where the voltage of the power storage element is detected by a member different from the linking portion.

(5) It is preferable that a protruding height of the thermistor from the flexible substrate in a state where the thermistor is attached to the flexible substrate is lower than or equal to a protruding height of the extension portion from the flexible substrate in a state where the through hole of the extension portion is closed off by the flexible substrate.

After the through hole is filled with the resin, the resin that has flowed out of the through hole is removed by scraping the upper surface of the extension portion with a squeegee, a doctor blade, or the like. Accordingly, the amount of the resin filling the through hole is made uniform, and thus the thermal capacity of the resin is also made uniform. Thus, the temperature measurement accuracy of the thermistor can be improved.

(6) The wiring module may be a vehicle wiring module to be installed for use in a vehicle. The thermistor is covered by the resin, and thus the wiring module is highly water resistant. Thus, the wiring module according to the present disclosure can be favorably used in a vehicle that is to be used in an environment where the humidity fluctuates.

Details of Embodiments of the Present Disclosure

Embodiments of the present disclosure will be described below. Note that the present invention is not limited to these illustrative examples, but is indicated by the claims, and all changes that come within the meaning and range of equivalency of the claims are intended to be embraced therein.

Embodiment 1

Embodiment 1 in which the present disclosure is applied to a power storage pack 2 installed in a vehicle 1 will be described, with reference to FIGS. 1 to 7. The power storage pack 2 is installed in the vehicle 1, which is an electric car, a hybrid car, or the like, and is used as a motive power source of the vehicle 1. In the following description, there may be cases where only some members of a plurality of members are given a reference numeral, and the other members are not be given a reference numeral.

Overall Configuration

As shown in FIG. 1, the power storage pack 2 is provided in the vicinity of the center of the vehicle 1. A power control unit (PCU) 3 is installed in the front portion of the vehicle 1. The power storage pack 2 and the PCU 3 are connected to each other by a wire harness 4. The power storage pack 2 and the wire harness 4 are connected to each other by a connector (not shown). The power storage pack 2 has a power storage module 10 that includes a plurality of power storage elements 11.

Figure 2:
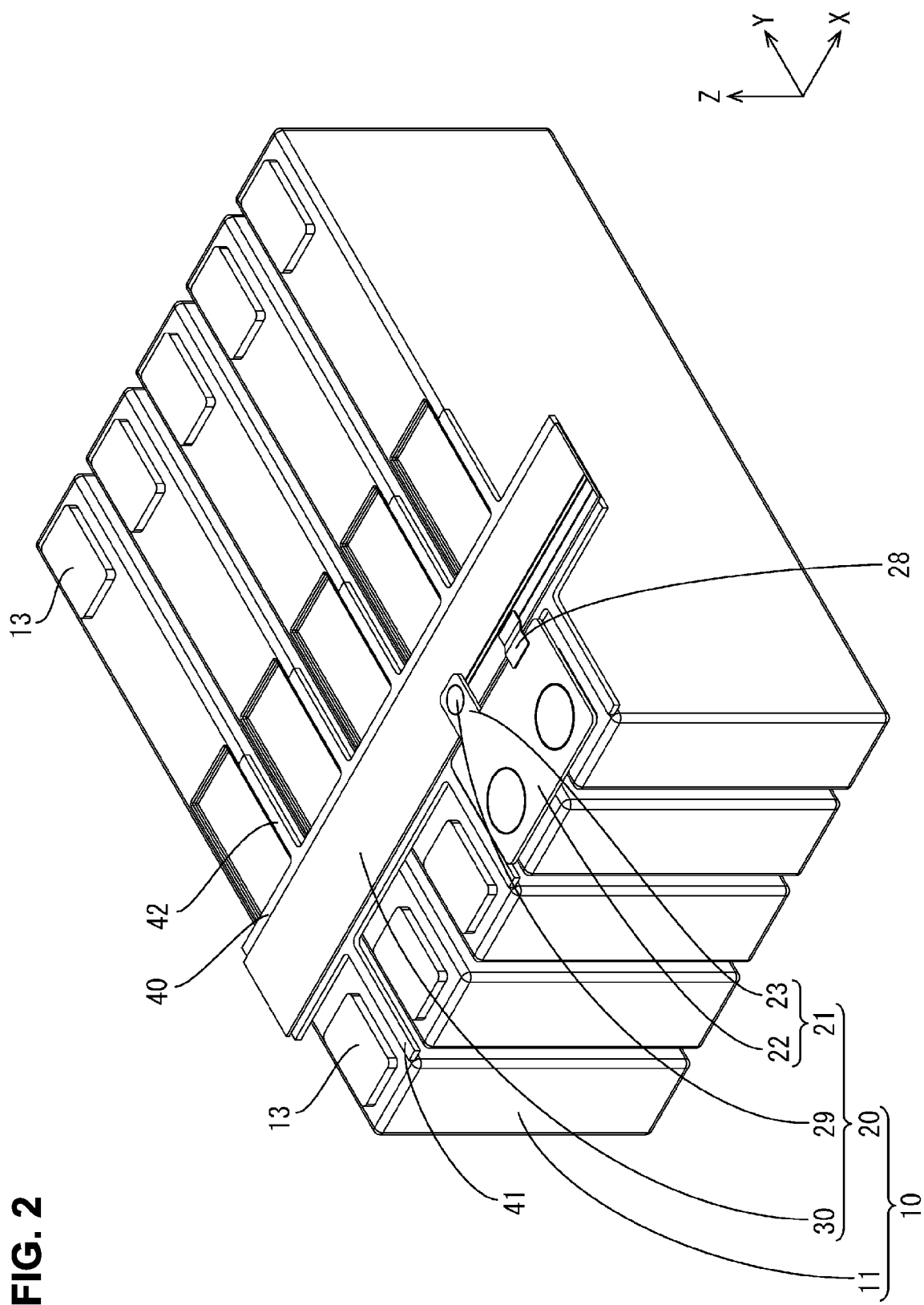
FIG. 2 is a perspective view showing the power storage module according to Embodiment 1.

As shown in FIG. 2, the power storage module 10 is provided with the power storage elements 11 that each have electrode terminals 13, and a wiring module 20 attached to the power storage elements 11. Below, the direction indicated by the Z arrow is described as the upward direction, the direction indicated by the Y arrow is described as the forward direction, and the direction indicated by the X arrow is described as the left direction. Also, there may be cases where only some members of a plurality of members are given a reference numeral and the other members are not be given a reference numeral.

Power Storage Element 11

Each power storage element 11 (an example of an object) has a flat parallelepiped shape that extends in the front-rear direction. The electrode terminals 13 protrude upward respectively from the left end portion and the right end portion of the upper surface of each power storage element 11. Out of the two electrode terminals 13 provided on one power storage element 11, one is a positive electrode and the other is a negative electrode.

Wiring Module 20

The wiring module 20 is provided at a portion toward the left end portion and a portion toward the right end portion of the upper surface of the power storage elements 11. In FIG. 2, the wiring module 20 disposed on the left end portion side of the power storage elements 11 is omitted.

The wiring module 20 is provided with a plurality of bus bars 21 and a flexible substrate 30. An insulating protector 40 made of an electrically insulating synthetic resin is disposed below the flexible substrate 30. In FIG. 2, one bus bar 21 of the plurality of bus bars 21 disposed in the wiring module 20 is shown and the others are omitted.

Bus Bar 21

Figure 3:
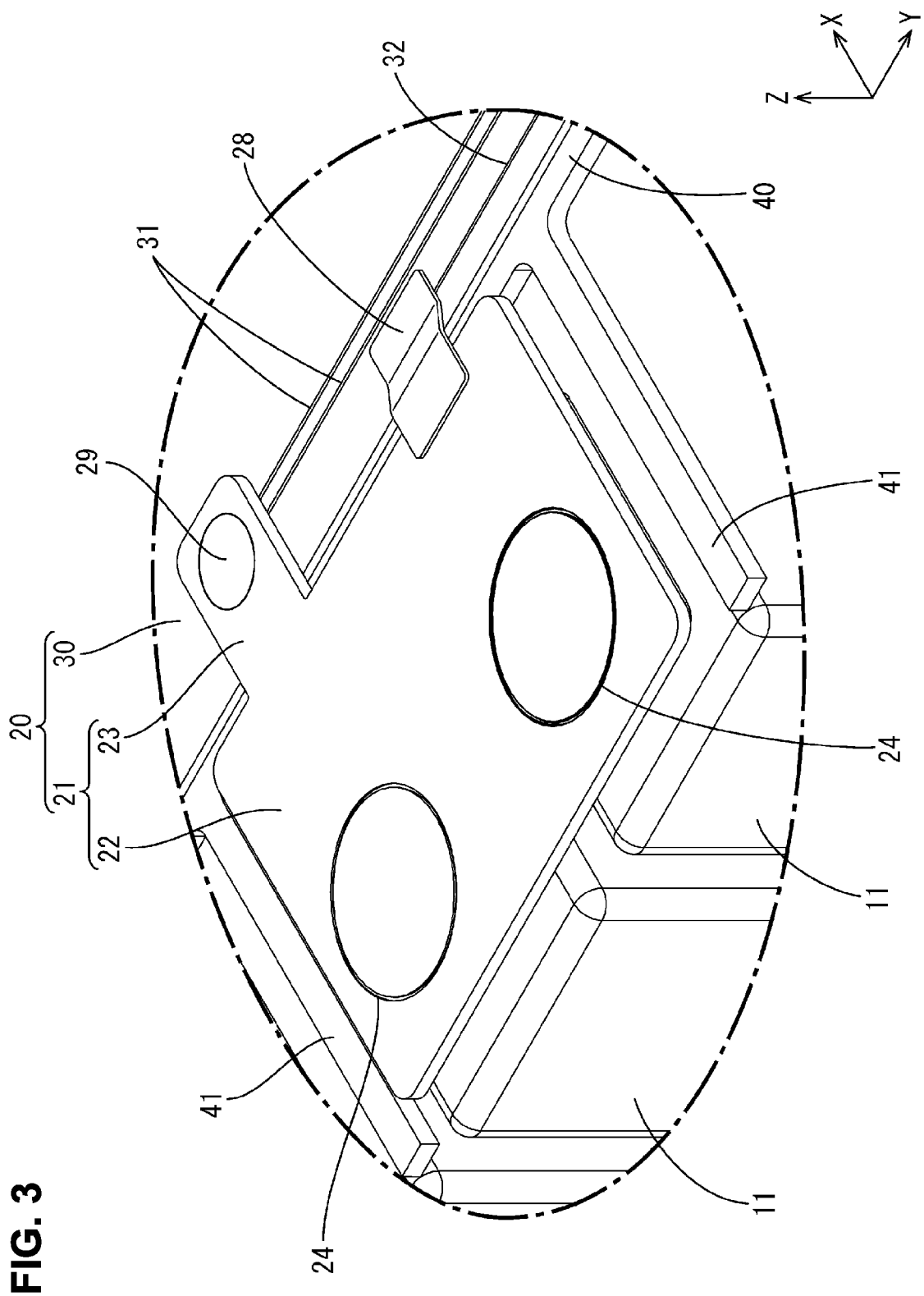
FIG. 3 is a partially enlarged perspective view showing a wiring module.
Figure 4:
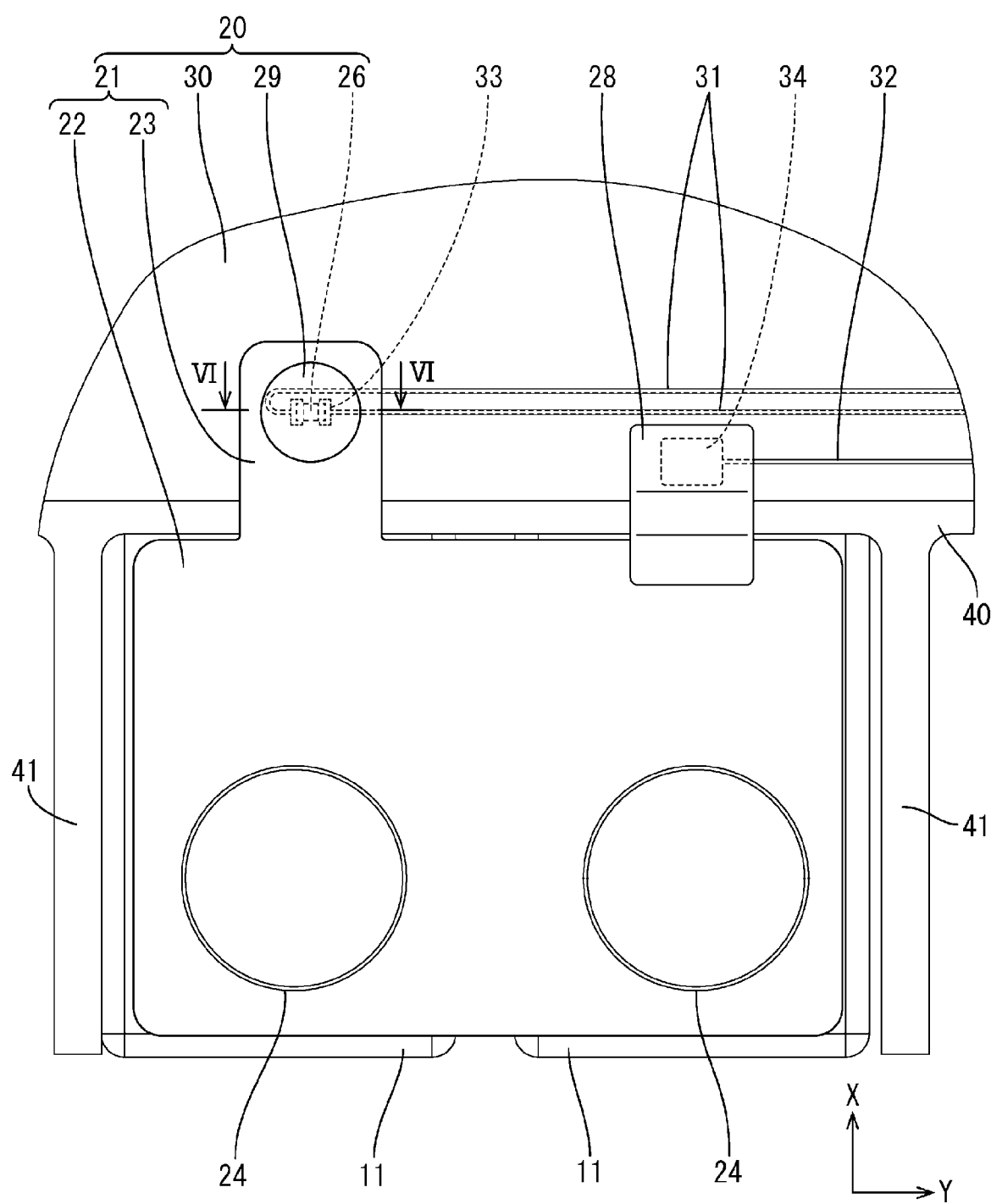
FIG. 4 is a partially enlarged plan view showing the wiring module.

As shown in FIGS. 3 and 4, the bus bar 21 is formed by pressing a metal plate material into a predetermined shape. As the metal constituting the bus bar 21, any metal such as copper, a copper alloy, aluminum, an aluminum alloy, and the like can be appropriately selected. The bus bar 21 has a main body portion 22 that has an elongated shaped in the front-rear direction when seen from above, and an extension portion 23 that extends leftward from a position near the rear end portion on the left side edge of the main body portion 22.

The bus bar 21 is connected to the adjacent electrode terminal 13 of a different power storage element 11. The length of the bus bar 21 in the front-rear direction is set to be long enough to cover adjacent electrode terminals 13 from above. The method with which the bus bar 21 and the electrode terminal 13 are connected may be realized using laser welding, soldering or the like, and is not particularly limited. In the present embodiment, the bus bar 21 and the electrode terminals 13 are laser welded to each other. Welding marks 24 that are circular in shape as seen from above are formed on the bus bar 21. The shape of the welding marks 24 is not particularly limited and may be linear.

Figure 5:
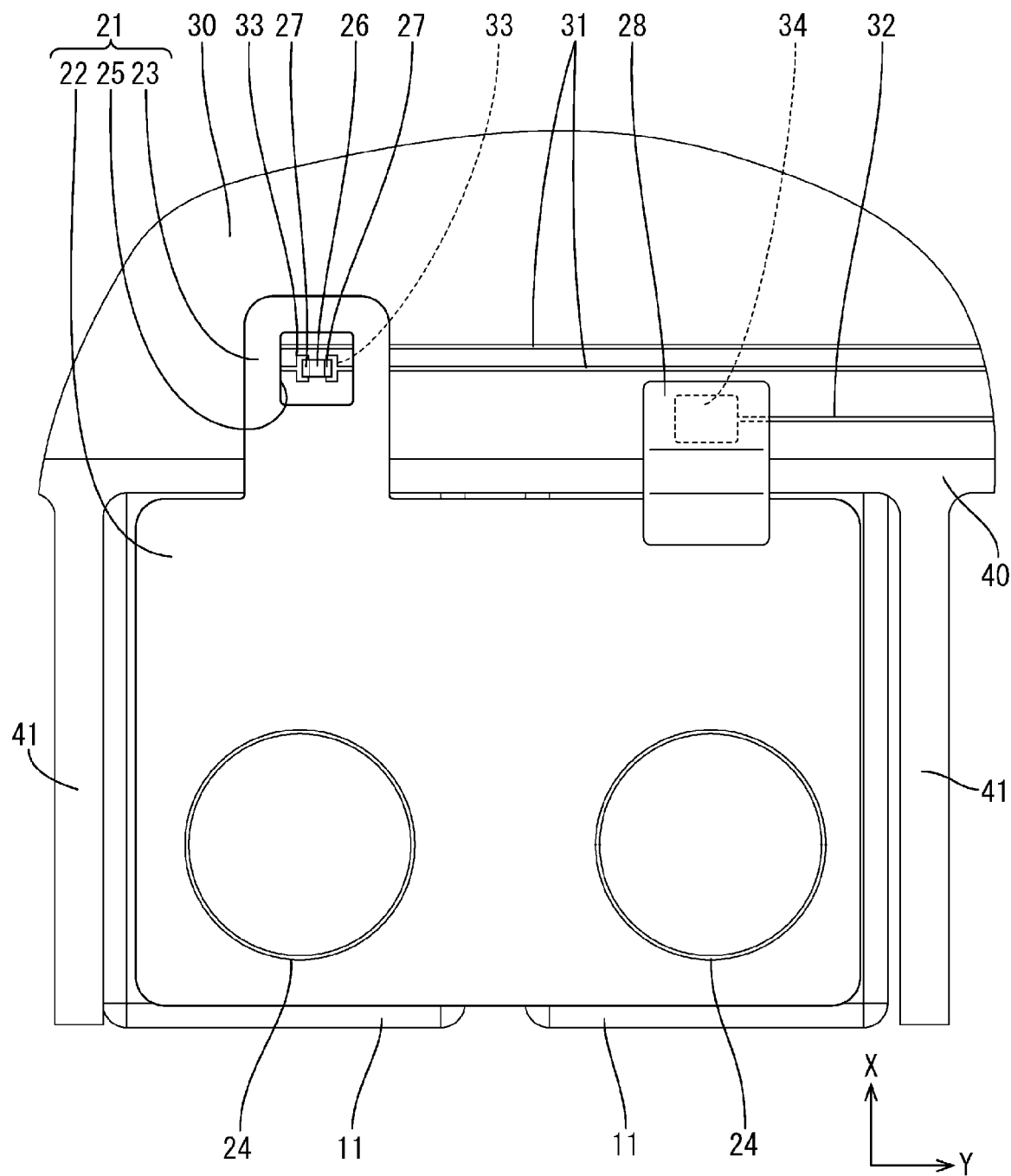
FIG. 5 is a plan view showing the wiring module prior to being filled with resin.

As shown in FIG. 5, the extension portion 23 is provided with a through hole 25 that extends through the extension portion 23 in the up-down direction. The through hole 25 is formed in a square shape with rounded corners, as seen in the up-down direction.

Flexible Substrate 30

Figure 6:
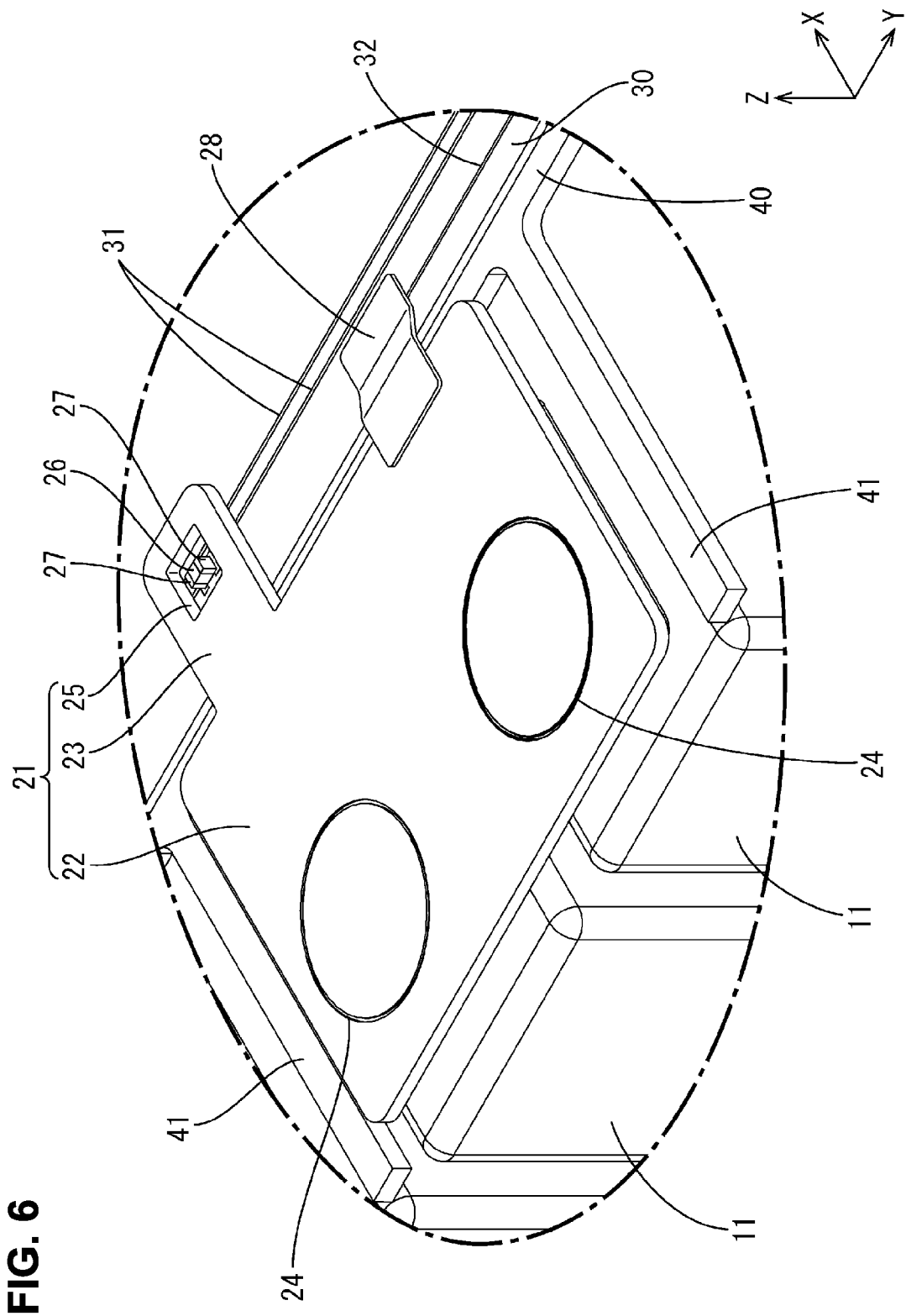
FIG. 6 is a perspective view showing the wiring module prior to being filled with resin.

As shown in FIGS. 5 and 6, the flexible substrate 30 according to the present embodiment is a flexible printed circuit (FPC). The flexible substrate 30 is provided with a first conductive path 31 and a second conductive path 32 made of a copper conductive foil on the upper or lower surface of a support substrate 35, which is formed of an insulating film, and the first conductive path 31 and the second conductive path 32 are covered by a coverlay layer (not shown). The first conductive path 31 and the second conductive path 32 are formed by patterning copper foil provided on the support substrate 35, using a known printed wiring technique.

Thermistors 26 are connected in series on the first conductive path 31 (see FIG. 4). As shown in FIG. 5, a pair of temperature measuring lands 33 are provided at the portion where the thermistor 26 is connected to the first conductive path 31. The thermistor 26 has a parallelepiped shape, and both end portions in the length direction of the thermistor 26 are provided with lead terminals 27. The lead terminals 27 are respectively connected to the pair of temperature measuring lands 33. The lead terminals 27 of the thermistor 26 and the temperature measuring lands 33 are connected to each other using a known technique such as soldering.

An end portion of the second conductive path 32 is provided with a voltage detection land 34 (an example of a connection land). A linking portion 28 is connected to the voltage detection land 34. The voltage detection land 34 and the linking portion 28 are connected to each other using a known method such as soldering.

The linking portion 28 is formed by pressing a metal plate material into a predetermined shape. As the metal constituting the linking portion 28, any metal such as copper, a copper alloy, aluminum, an aluminum alloy, nickel, a nickel alloy, and the like can be appropriately selected.

One end portion of the linking portion 28 is connected to a portion toward the front end portion of the left edge of the bus bar 21, and the other end portion of the linking portion 28 is connected to the voltage detection land 34 provided on the flexible substrate. The linking portion 28 and the bus bar 21 are connected to each other using a known method such as reflow soldering or laser welding.

Insulating Protector 40

As shown in FIG. 2, the insulating protector 40 is formed elongated in the front-rear direction. The width of the insulating protector 40 in the left-right direction is made larger than the width of the flexible substrate 30 in the left-right direction. The flexible substrate 30 is attached to the upper surface of the insulating protector 40. The means by which the insulating protector 40 and the flexible substrate 30 are fixed to each other is not particularly limited, and they may be adhered to each other using an adhesive, fixed to each other by using a separate member such as a screw or clip, or may be fixed to each other through thermal welding, for example.

The right edge of the insulating protector 40 is provided with a plurality of partition walls 41 that protrude rightward and are spaced apart from each other. The partition walls 41 are located on the front side and the rear side of the bus bar 21 in a state where the bus bar 21 is connected to the flexible substrate 30. Accordingly, bus bars 21 adjacent to each other in the front-rear direction are spaced apart from each other by a partition wall 41.

The left edge of the insulating protector 40 is provided with a plurality of partition walls 42 that protrude leftward and are spaced apart from each other in the front-rear direction. In a state where the wiring module 20 is attached to the power storage elements 11, the partition walls 42 are located between adjacent power storage elements 11 and partition adjacent power storage elements 11.

Resin 29

As shown in FIGS. 5 and 6, in a state where the extension portion 23 of the bus bar 21 is placed on the upper surface of the flexible substrate 30, the lower side (flexible substrate 30 side) of the through hole 25 is closed off by the flexible substrate 30. The thermistor 26, the temperature measuring lands 33, and a portion of the first conductive path 31 are positioned in the through hole 25 of the extension portion 23. The internal shape of the through hole 25 is formed larger than the outer shape of the thermistor 26. The thickness of the extension portion 23 of the bus bar 21 in the up-down direction is set to be substantially the same dimension as the height of the thermistor 26. "Substantially the same" includes a case where the two lengths are the same and a case where the two lengths can be recognized as being the same even if they are different.

Figure 7:
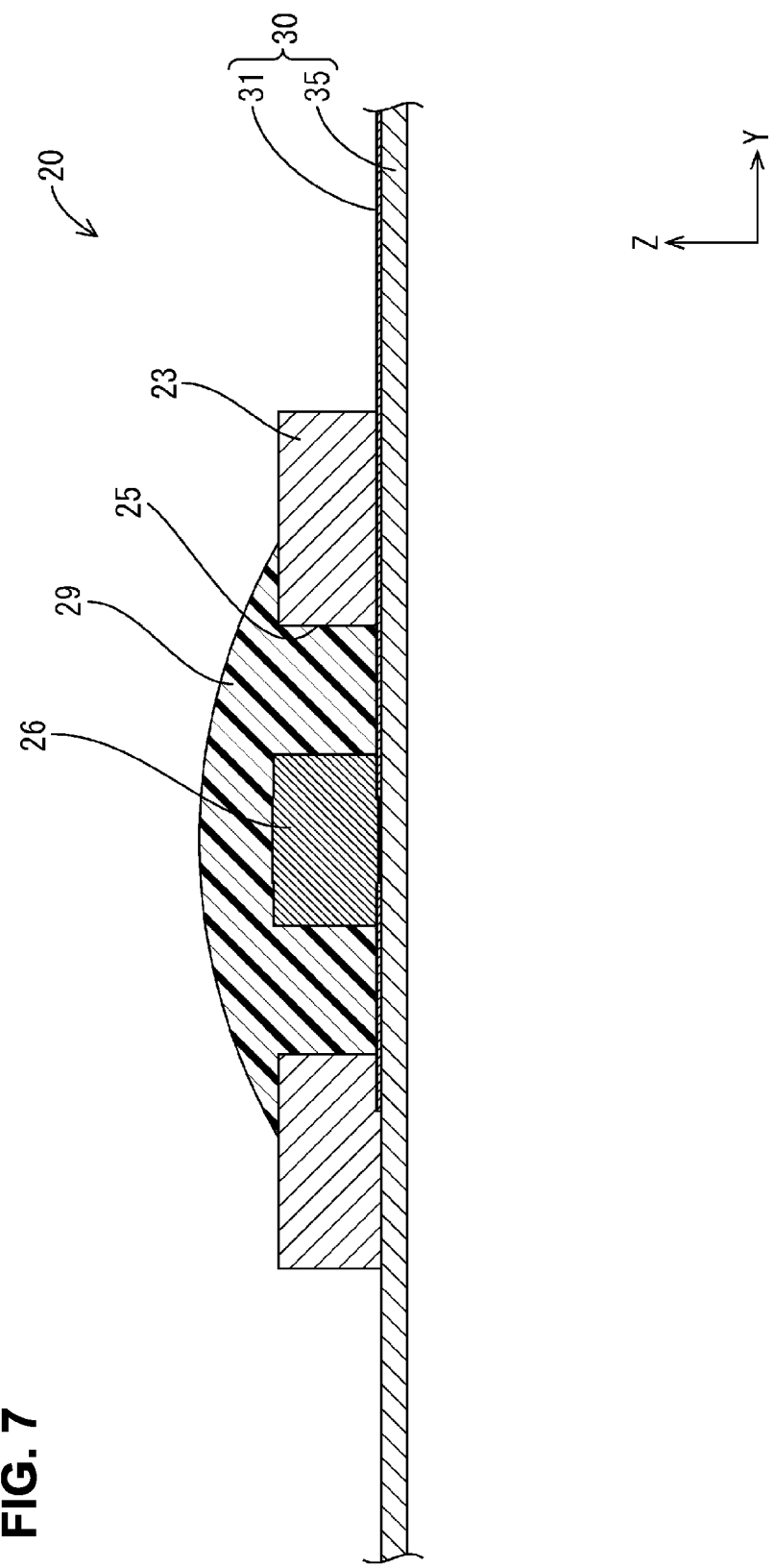
FIG. 7 is a cross-sectional view taken along line VI-VI shown in FIG. 4.

As shown in FIG. 7, the through hole 25 is filled with the resin 29 in a state where the thermistor 26 is located inside the through hole 25. The resin 29 fixes the bus bar 21 and the flexible substrate 30 to each other.

The resin 29 contains a synthetic resin, and has the property of being fluid when filled into the through hole 25, and solidifying after being filled into the through hole 25. The resin 29 may contain a solvent, and may contain an additive such as an antioxidant. A known material such as a so-called potting material or an adhesive can be appropriately selected as the resin 29. The resin 29 is preferably made of a material that has comparatively high thermal conductivity. This is because heat can be swiftly conveyed from the extension portion 23 to the thermistor 26.

The through hole 25 is filled with enough of the resin 29 to at least cover the upper end portion of the bus bar 21 with the resin 29. Accordingly, the thermistor 26 is embedded in the resin 29. In the present embodiment, the resin 29 is filled into the through hole 25 so as to bulge upward past the upper end portion of the bus bar 21. Accordingly, the resin 29 enters a state where it flows outward from the hole edge of the through hole 25. In a state where the through hole 25 is filled with the resin 29, the resin 29 has a circular shape as seen from above.

The space between the extension portion 23 and the flexible substrate 30 is liquid tight. A configuration may be employed where the extension portion 23 and the flexible substrate 30 are fixed to each other in a liquid-tight state by filling the through hole 25 with the resin 29 in a state where the extension portion 23 and the flexible substrate 30 are in close contact, or the space between the extension portion 23 and the flexible substrate 30 may be made liquid-tight by solidifying the resin 29 that has entered a gap between the extension portion 23 and flexible substrate 30. Accordingly, the internal space of the through hole 25 is made liquid-tight.

Manufacturing Process of Embodiment

Next, an example of a manufacturing process of the wiring module according to the present embodiment will be described. The manufacturing process of the wiring module is not limited to that described below.

The first conductive path 31 and the second conductive path 32 are formed on the flexible substrate 30 using a printed wiring technique. The insulating protector 40 is adhered to the lower surface of the flexible substrate 30. The thermistor 26 is placed on the temperature measuring lands 33 and the lead terminals 27 of the thermistor 26 are respectively soldered to the temperature measuring lands 33, and the linking portion 28 is placed on the voltage detection land 34 and the voltage detection land 34 and the linking portion 28 are soldered to each other.

The bus bar 21 is placed on the upper surface of the flexible substrate 30 so that the thermistor 26 is positioned inside the through hole 25 provided in the extension portion 23 of the bus bar 21. The through hole 25 is filled with the resin 29 in a liquid state using a known dispenser or the like. At this time, the through hole 25 may be filled with the resin 29 in a state where the extension portion 23 and the flexible substrate 30 are in close contact due to the extension portion 23 being pressed against the flexible substrate 30 from above by a jig. The through hole 25 may be filled with the resin 29 of an amount that is slightly greater than that of the inner volume of the through hole 25. Thus, the wiring module 20 is complete.

A plurality of power storage elements 11 are lined up in the front-rear direction. The wiring module 20 is placed on the upper surface of the power storage elements 11. The bus bar 21 and the electrode terminals 13 of the power storage elements 11 are laser-welded together. Thus, the power storage module 10 is complete.

Operation and Effects of Present Embodiment

Next, operation and effects of the present embodiment will be described. The present embodiment is a wiring module 20 to be attached to a plurality of power storage elements 11 each having an electrode terminal 13, the wiring module 20 including: a bus bar 21 to be connected to the electrode terminals 13; and a flexible substrate 30 that is flexible, wherein the bus bar 21 has an extension portion 23 that extends toward the flexible substrate 30, the extension portion 23 has a through hole 25, the flexible substrate 30 side of the through hole 25 is closed off by the flexible substrate 30, the flexible substrate 30 has a first conductive path 31 for detecting the temperature of an object, and the first conductive path 31 is connected to a thermistor 26, and the thermistor 26 is disposed in the through hole 25, the through hole 25 is filled with a resin 29, and the thermistor 26 is covered with the resin 29.

Heat generated by the power storage element 11 when a current passes therethrough is conveyed to the bus bar 21 via the electrode terminals 13. Heat transmitted to the bus bar 21 is thermally conducted into the bus bar 21 and is conveyed to the extension portion 23. Heat conveyed to the extension portion 23 is thermally transmitted to the resin 29 filling the through hole 25. Heat conveyed to the resin 29 is thermally conducted to the inner portion of the resin 29, and is thermally transmitted to the thermistor 26. Accordingly, the thermistor 26 can measure the temperature of the power storage element 11.

If the amount of resin 29 covering the thermistor 26 is uneven, the thermal capacity of the resin 29 will also be uneven, and thus there is a concern of the ability of the thermistor 26 to measure temperature being diminished.

With the present embodiment, the inner region of the through hole 25 closed off by the flexible substrate 30 can be filled with a predetermined volume of the resin 29. Thus, the amount of the resin 29 filled into the through hole 25 can be kept from varying. As a result, the thermal capacity of the thermistor 26 and the resin 29 covering the thermistor 26 can be kept from varying, and thus the temperature measurement accuracy of the thermistor 26 can be improved.

With the present embodiment, the space between the extension portion 23 and the flexible substrate 30 is liquid-tight.

As a result of the space between the extension portion 23 and the flexible substrate 30 being liquid-tight, the resin 29 filled into the through hole 25 closed off by the flexible substrate 30 is kept from leaking to the outside from a gap formed between the extension portion 23 and the flexible substrate 30. Accordingly, the amount of the resin 29 filled into the through hole 25 can be further kept from varying, and the temperature measurement accuracy of the thermistor 26 can be further improved.

Also, the wiring module 20 according to the present embodiment has the linking portion 28 that extends from the bus bar 21 to the flexible substrate 30, and the linking portion 28 is connected to the voltage detection land 34 provided on the flexible substrate 30.

The bus bar 21 and the flexible substrate 30 are connected to each other by the linking portion 28, and thus the mechanical strength of the portion where the bus bar 21 and the flexible substrate 30 are connected can be improved.

Also, according to the present embodiment, the flexible substrate 30 has the second conductive path 32 that detects the voltage of the power storage element 11, and the voltage detection land 34 is connected to the second conductive path 32.

The voltage of the power storage element 11 can be detected via the linking portion 28, and thus the number of parts can be reduced compared to a case where the voltage of the power storage element 11 is detected by a member different from the linking portion 28.

The wiring module 20 according to the present embodiment is a vehicle wiring module 20 to be installed for use in the vehicle 1. In the present embodiment, the thermistor 26 is covered with the resin 29, and thus the wiring module 20 is highly water resistant. Thus, the wiring module 20 according to the present embodiment can be favorably used in a vehicle 1 that is to be used in an environment where the humidity fluctuates.

Embodiment 2

Figure 8:
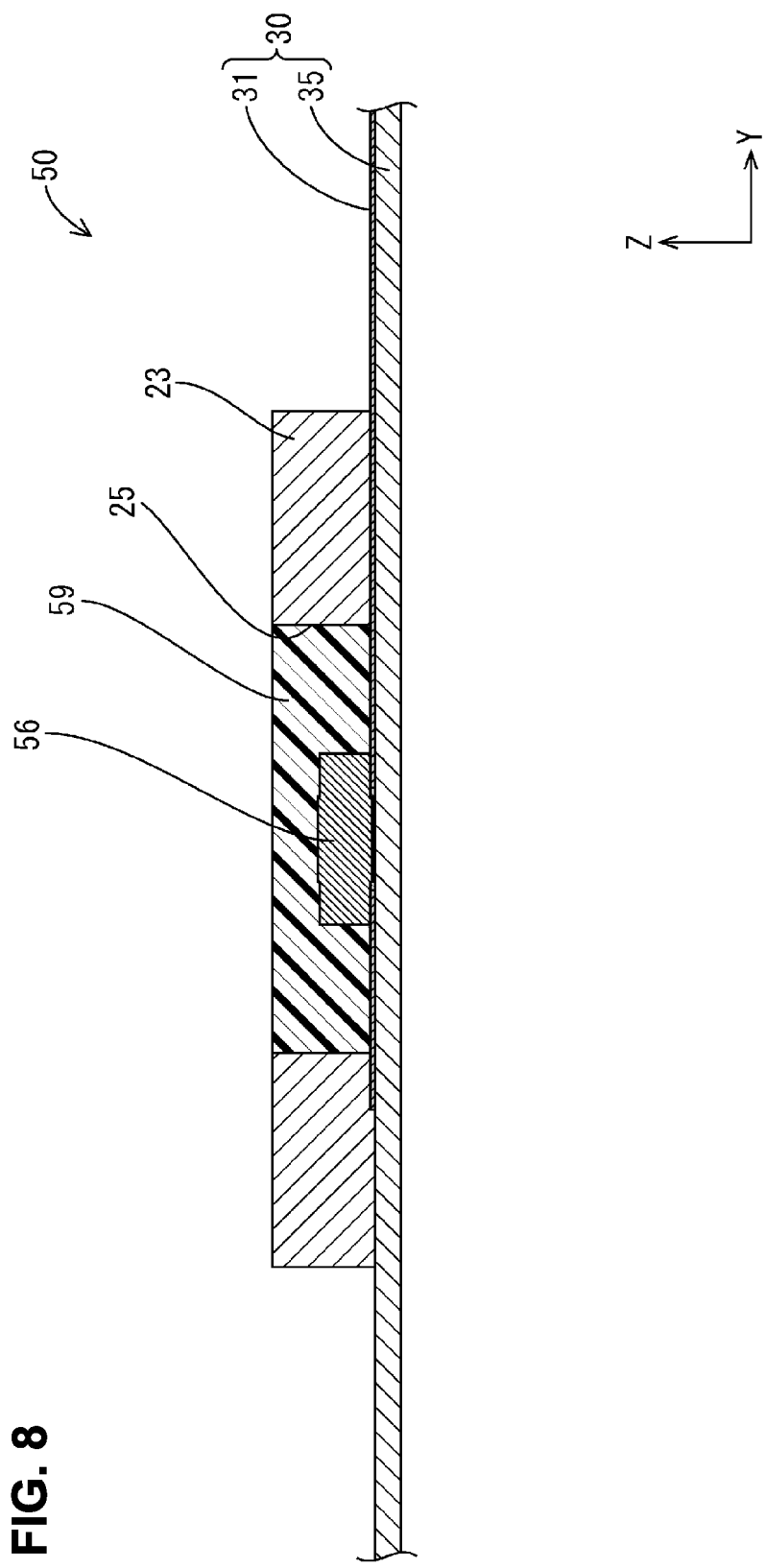
FIG. 8 is a cross-sectional view of a thermistor embedded in resin in a wiring module according to Embodiment 2.

Next, Embodiment 2 of the present disclosure will be described with reference to FIG. 8. In a wiring module 50 according to the present embodiment, the protruding height of the thermistor 26 from the upper surface of the flexible substrate 30 in a vertical direction, in a state where the thermistor 26 is attached to the upper surface of the flexible substrate 30, is set to be lower than or equal to the protruding height of the extension portion 23 from the upper surface of the flexible substrate 30 in a state where the through hole 25 of the extension portion 23 is closed off by the flexible substrate 30.

The relative positional relation between the upper surface of resin 59 filled into the through hole 25 and the upper surface of the extension portion 23 is not particularly limited. For example, the upper surface of the resin 59 filled into the through hole 25 may be flush with the upper surface of the extension portion 23, may bulge upward past the upper surface of the extension portion 23, or may be recessed to a position lower than the upper surface of the extension portion 23.

In the present embodiment, the height position of the upper surface of the resin 59 filled into the through hole 25 is set to be substantially the same as the height position of the upper surface of the extension portion 23 in the up-down direction. "Substantially the same" includes a case where the height positions are the same and also a case where the height positions can be recognized as being the same even if they are different.

Configurations not including those described above are approximately the same as those in Embodiment 1, and thus like members are given like reference numerals and redundant description is omitted.

In the present embodiment, the resin 59 is filled into the through hole 25 in a liquid state using a known dispenser or the like. Then, the resin 59 is moved while bringing a squeegee, a doctor blade, or the like into contact with the upper surface of the extension portion 23. Accordingly, the resin 59 that has overflowed from the through hole 25 is removed, and the upper surface of the resin 59 is made flush with the upper surface of the extension portion 23. As a result, the amount of the resin 59 filled into through hole 25 is made equal, and thus the thermal capacity of the resin 59 is also made uniform. Accordingly, the temperature measurement accuracy of the thermistor 56 can be improved.

Other Embodiments (1) The internal shape of the through hole 25 formed in the extension portion 23 may have a polygonal shape such as a triangle or a pentagon, a round shape, or an oval shape as seen from above.
(2) In the present embodiment, the linking portion 28 is separate from the bus bar 21, but the present invention is not limited to this, and a configuration may be employed where the linking portion 28 and the bus bar 21 are formed as one piece, and, for example, a configuration can be employed where the linking portion 28 extends from the bus bar 21 toward the voltage detection land 34 of the flexible substrate 30. Also, the linking portion 28 may be omitted.
(3) In the above-described embodiment, the flexible substrate 30 is described as being a flexible printed circuit, but there is no limitation to this, and the flexible substrate 30 may be a flexible flat cable (FFC).
(4) The bus bar 21 may be configured to be connected to one or three or more electrode terminals 13.
(5) The power storage element 11 may be a secondary battery, or a capacitor.
(6) In Embodiment 1, the thermistor 26 and the extension portion 23 of the bus bar 21 have substantially the same height, and in Embodiment 2, the thermistor 56 has a smaller height than that of the extension portion 23 of the bus bar 21, but there is no limitation to this, and the protruding height of the thermistor from the upper surface of the flexible substrate may be greater than the protruding height of the extension portion from the upper surface of the flexible substrate in a state where the through hole of the extension portion is closed off by the flexible substrate.

LIST OF REFERENCE NUMERALS

1 Vehicle
2 Power storage pack
3 PCU
4 Wire harness
10 Power storage module
11 Power storage element
13 Electrode terminal
20, 50 Wiring module
21 Bus bar
22 Main body portion
23 Extension portion
24 Welding mark
25 Through hole
26, 56 Thermistor
27 Lead terminal
28 Linking portion
29, 59 Resin
30 Flexible substrate
31 First conductive path
32 Second conductive path
33 Temperature measuring land
34 Voltage detection land
35 Support substrate
40 Insulating protector
41 Partition wall
42 Partition wall

The invention claimed is:

1. A wiring module to be attached to a plurality of power storage elements each having an electrode terminal, the wiring module comprising:
   a bus bar configured to be connected to the electrode terminals; and a flexible substrate that is flexible,
   wherein the bus bar has an extension portion that extends toward the flexible substrate, the extension portion has a through hole, the flexible substrate side of the through hole is closed off by the flexible substrate, the flexible substrate has a first conductive path for detecting the temperature of an object, and the first conductive path is connected to a thermistor, and
   the thermistor is disposed in the through hole, the through hole is filled with a resin, and the thermistor is covered with the resin.

2. The wiring module according to claim 1, wherein the space between the extension portion and the flexible substrate is liquid-tight.

3. The wiring module according to claim 1,
further comprising a linking portion extending from the bus bar to the flexible substrate,
wherein the linking portion is connected to a connection land provided on the flexible substrate.

4. The wiring module according to claim 3,
wherein the flexible substrate has a second conductive path configured to detect the voltages of the power storage elements, and the connection land is connected to the second conductive path.

5. The wiring module according to claim 1,
wherein a protruding height of the thermistor from the flexible substrate in a state where the thermistor is attached to the flexible substrate is lower than or equal to a protruding height of the extension portion from the flexible substrate in a state where the through hole of the extension portion is closed off by the flexible substrate.

6. The wiring module according to claim 1 is a vehicle wiring module to be installed for use in a vehicle.

* * * * *